(12) United States Patent
Schilling et al.

(10) Patent No.: US 7,352,587 B2
(45) Date of Patent: Apr. 1, 2008

(54) POWER SEMICONDUCTOR MODULE HAVING A HALF-BRIDGE CONFIGURATION

(75) Inventors: Oliver Schilling, Warstein (DE); Martin Woelz, Soest (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/555,764

(22) Filed: Nov. 2, 2006

(65) Prior Publication Data
US 2007/0177358 A1 Aug. 2, 2007

(30) Foreign Application Priority Data
Jan. 27, 2006 (DE) .................. 10 2006 004 031

(51) Int. Cl.
*H05K 7/02* (2006.01)

(52) U.S. Cl. ...................... 361/733; 361/820
(58) Field of Classification Search ................ 361/730, 361/733, 820
See application file for complete search history.

(56) References Cited

FOREIGN PATENT DOCUMENTS

EP          0 427 143 A2 *  11/1990

* cited by examiner

*Primary Examiner*—Evan Pert
(74) *Attorney, Agent, or Firm*—Dick Billig Czaja, PLLC

(57) ABSTRACT

A power semiconductor module having a carrier plate, on which at least four substrates are arranged, and having a first and a second busbar having two conductive plates is disclosed. The conductive plates are arranged such that they are at a distance from one another and are insulated from one another, for respectively carrying a lower and an upper electrical potential, said busbars each being fitted with outer connecting lugs which lead away from the substrates and inner connecting lugs on the substrate side. Symmetrization of the current during dynamic commutation operations is achieved by correctly selecting the order of the outer connecting lugs of the respective first busbar for a lower potential and of the second busbar for an upper potential in accordance with the order of the inner connecting points of the parallel-connected half-bridge circuits and also of the inner connecting lugs of the first busbar and of the second busbar.

20 Claims, 7 Drawing Sheets

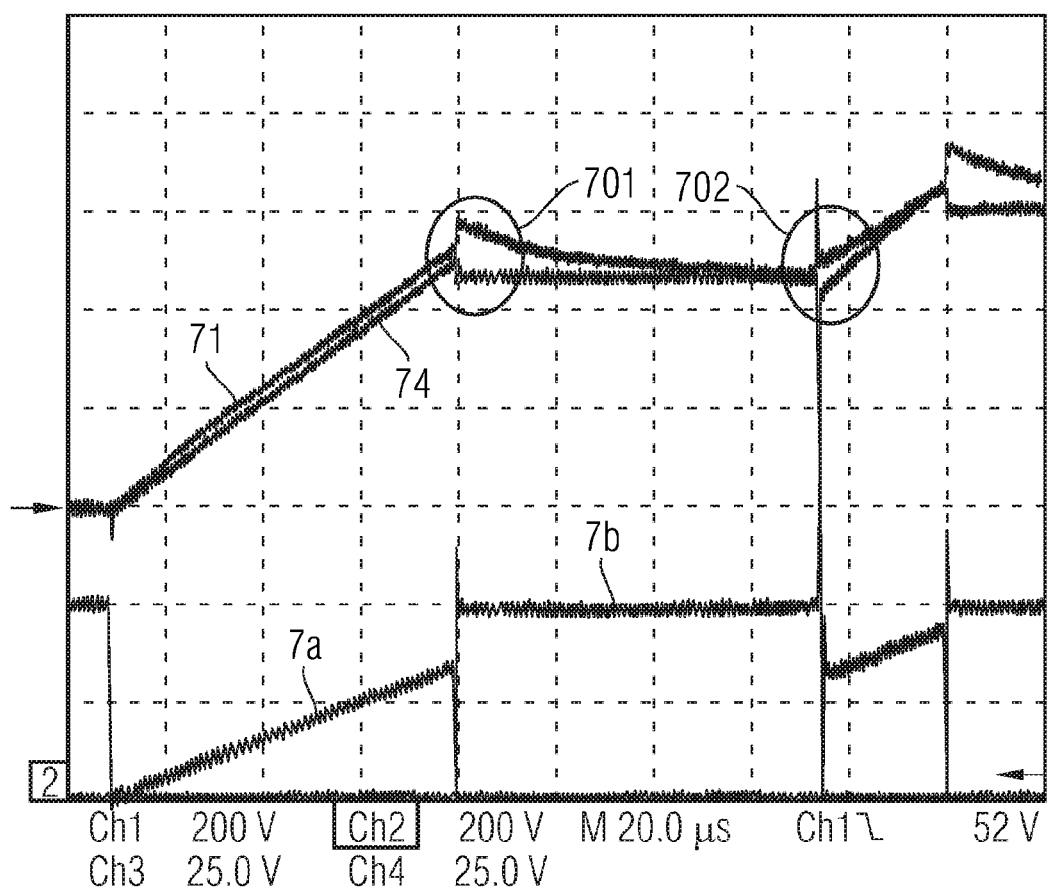

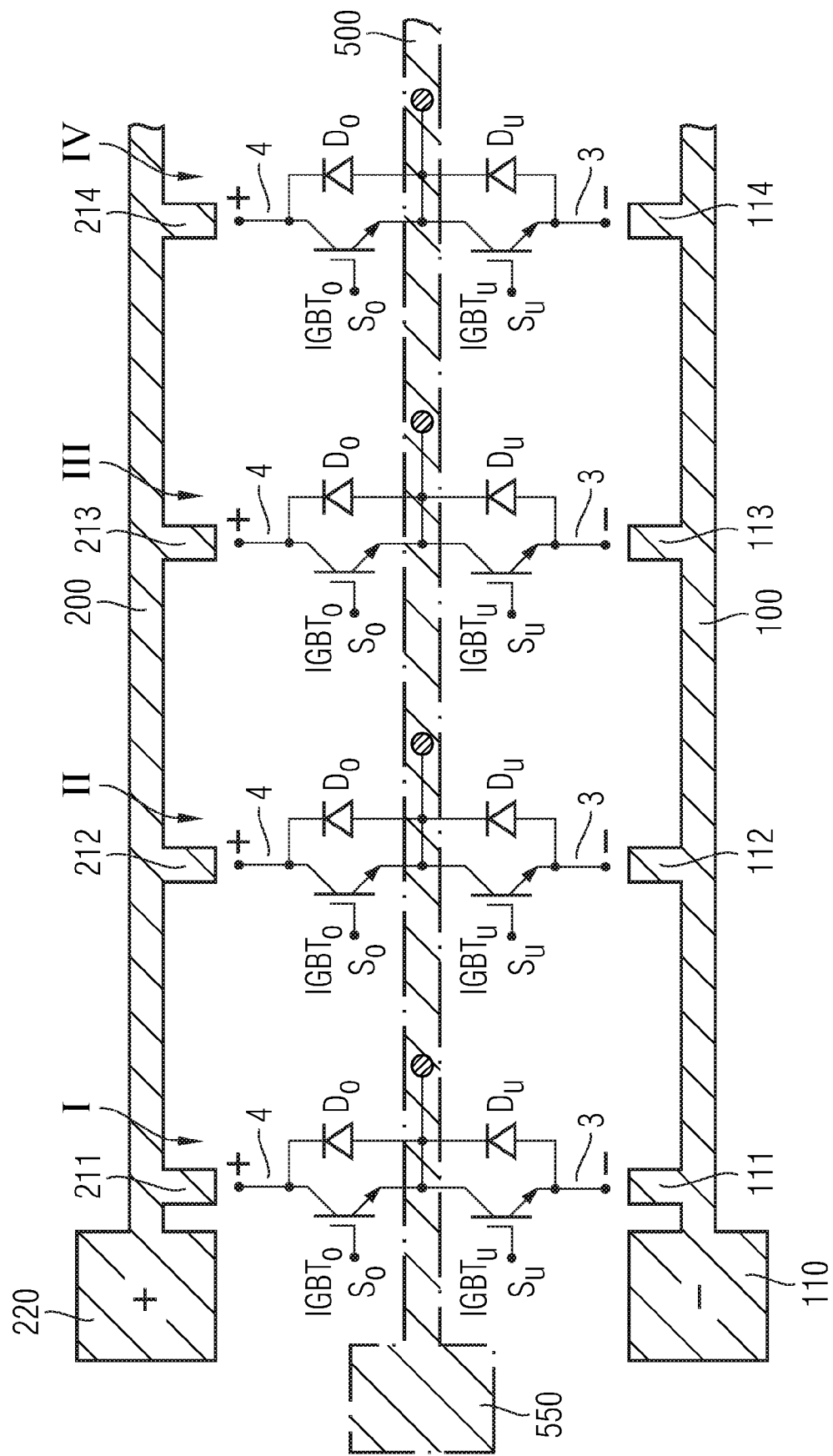

POWER SEMICONDUCTOR MODULE HAVING A HALF-BRIDGE CONFIGURATION

CROSS-REFERENCE TO RELATED APPLICATIONS

This Utility Patent Application claims priority to German Patent Application No. DE 10 2006 004 031.7 filed on Jan. 27, 2006, which is incorporated herein by reference.

BACKGROUND

The invention relates to a power semiconductor module and concerns, in particular, a power semiconductor module having a carrier plate, on which at least four substrates are arranged, and having a first and a second busbar having two conductive plates, which are arranged such that they are at a distance from one another and are insulated from one another, for respectively carrying a lower and an upper electrical potential, said busbars each being fitted with outer connecting lugs which face away from the substrates and inner connecting lugs on the substrate side. Such a power semiconductor module is disclosed in EP 0 427 143 B1.

Power semiconductor modules having half-bridges are used, for example, to construct three-phase converters for electrical drives. Such converters contain a rectifier section, a DC intermediate circuit having a capacitor, and an inverter section. The power section of the inverter can be constructed from half-bridge circuits. Half-bridge circuits which contain, for example, fast-switching IGBT transistors as semiconductor switches and very fast freewheeling diodes are suitable for this purpose.

In the respective half-bridge circuits, it is particularly important to symmetrize the commutation operations:

the IGBT transistor switches off and the current commutates into the diode, and the IGBT transistor switches on and the current commutates into the IGBT transistor.

For these and other reasons, there is a need for the present invention.

SUMMARY

One embodiment provides a power semiconductor module having a carrier plate, on which at least four substrates are arranged, and having a first and a second busbar comprising two conductive plates, which are arranged such that they are at a distance from one another and are insulated from one another, for respectively carrying a lower and an upper electrical potential, said busbars each being fitted with outer connecting lugs which lead away from the substrates and inner connecting lugs on the substrate side. Symmetrization of the current during dynamic commutation operations is achieved by correctly selecting the order of the outer connecting lugs of the respective first busbar for a lower potential and of the second busbar for an upper potential in accordance with the order of the inner connecting points of the parallel-connected half-bridge circuits and also of the inner connecting lugs of the first busbar and of the second busbar.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4B uses graphs to illustrate current profiles during commutation operations in a half-bridge having a busbar structure as illustrated in FIG. 2 (not according to the invention).

FIG. 6 illustrates an equivalent circuit diagram of a power semiconductor module which includes four half-bridges and has schematically indicated busbars which do not have the inventive structure.

DETAILED DESCRIPTION

Figure 1A:
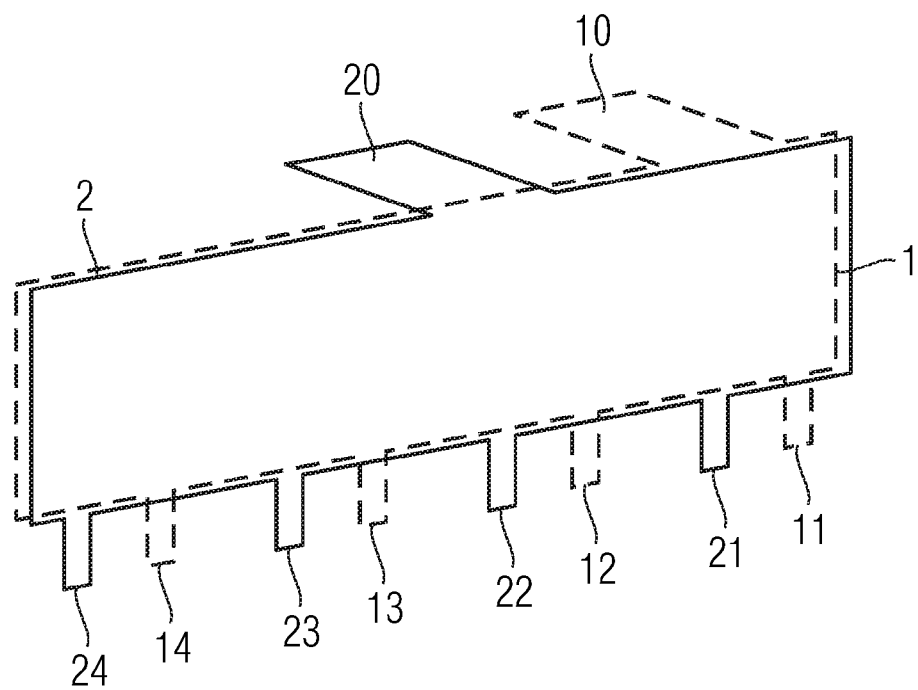
FIG. 1A illustrates the structure of the busbars which are used in the inventive power semiconductor module and are respectively intended for the lower (negative potential) and upper (positive potential) electrical potentials.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an improved, simple and cost-effective symmetrization of the commutation operations between the semiconductor switches and the freewheeling diodes of the half-bridges.

According to one embodiment of the invention of a power semiconductor module, the substrates are located in a row on the carrier plate, components are connected to form an electrical half-bridge on each individual substrate, and the connecting points for the respective lower and upper potentials of all substrates are connected in parallel using the inner connecting lugs of the respective first busbar, which carries the lower potential, and of the second busbar, which carries the upper potential, the base points of the inner connecting lugs of the respective first busbar, which carries the lower potential, and of the second busbar, which carries the upper potential, being arranged behind one another in a row at the connecting points, which are associated with said connecting lugs, of the substrates in the direction of the row of the latter, and the order of the connecting points for the lower and upper potentials corresponding exactly to the order of the outer connecting lugs on the two busbars in the direction of the row of the substrates for each individual substrate.

With the present the symmetrization of the commutation operations can be improved by correctly selecting the order of the outer connecting lugs of the busbars relative to the order of the inner connecting points of the parallel-connected half-bridges on the substrate plane. In this case, the fact that the geometric connecting lines between the outer connecting lugs of the busbars and the respective connecting point for the lower and upper potentials of the respective half-bridge on the substrate plane must not cross must apply to each individual substrate in the power semiconductor module. This gives rise to "main current directions" which favor symmetrization of the current in the case of dynamic operations. In this case, the order of the outer connecting lugs along the module axis must be the same as in each individual substrate at the level of the inner connecting lugs which are situated between the busbars and the half-bridge on the substrate.

In one embodiment, the outer connecting lugs for the respective lower and upper potentials are arranged at one end of the busbars, that is to say also at one end of the module longitudinal axis, for example.

In one embodiment, the row of the substrates lies in the direction of the module longitudinal axis and the conductive plates of the busbars are plane-parallel to one another and are along the longitudinal axis of the module. In the case of the last-mentioned embodiment, the plane-parallel plates of the busbars are arranged at a right angle to the plane of the carrier plates.

In this case, the inner connecting lugs of the respective busbar can lie in their respective plate plane or they may also have strain relief in the form of a horizontal partial section.

In another embodiment of the power semiconductor module according to the invention, the inner connecting lugs can be effectively extended by means of slots, which are made in the plates of the busbars, in such a manner that the inductance elements which are effective during commutation operations are changed in such a manner that they improve the symmetrization of the switching behavior even further.

In the case of the inventive power semiconductor module, recesses may also be provided in the plane-parallel plates of the busbars in order to influence eddy current effects.

According to one embodiment, an inventive semiconductor module is completed with an additional third busbar having inner connecting lugs which connect the alternating current connections of the half-bridge substrates to one another.

In the case of the inventive power semiconductor module, the main current directions produced by correctly selecting the order of the inner connecting points of the parallel-connected half-bridges on the substrate plane and the order of the associated inner connecting lugs of the busbars relative to the order of the outer connecting lugs of the busbars favor symmetrization of the current in the case of dynamic operations, that is to say at the commutation times, thus minimizing redistribution effects of the load current during the commutation operations.

A basic structure of a power semiconductor module which can be used, for example, as an inverter section of a three-phase converter will first of all be explained with reference to the equivalent circuit diagram illustrated in FIG. 6.

The power semiconductor module illustrated in FIG. 6 includes, in this example, four half-bridge circuit units I, II, III and IV which are connected in parallel. In each half-bridge circuit unit, two power switching elements IGBTo and IGBTu are connected in series between a positive connection 4 and a negative connection 3. The power switching elements are each an insulated gate bipolar transistor (IGBT). An upper freewheeling diode Do is connected in parallel with each upper power switching element IGBTo and a lower freewheeling diode Du is connected in parallel with each lower power switching element IGBTu. The common node between the upper and lower power switching elements IGBTo and IGBTu and between the upper and lower freewheeling diodes Do and Du respectively corresponds to the joint load connection. The two power switching elements IGBTo and IGBTu are driven by a respective control connection So and Su. As illustrated in FIG. 6, all of the positive connections 4 of the half-bridge units I-IV are connected in parallel using a first busbar 200 having inner connecting lugs 211-214 and an outer connecting lug 220. All of the negative connections 3 of the half-bridge units I-IV are equally connected in parallel using a second busbar 100 having inner connecting lugs 111-114 and an outer connecting lug 110. The joint load connections are also connected in parallel using a further busbar 500 which is fitted with an outer connecting lug 550.

During operation of the power semiconductor module illustrated in FIG. 6, the upper and lower power switching elements IGBTo and IGBTu are alternately opened and closed. During the commutation operation which takes place in the process, freewheeling currents flow through the respective associated freewheeling diodes Do and Du. For example, if one of the half-bridge units is considered, the upper power switching element IGBTo switches off during a commutation operation and the current commutates into the diodes Do, Du which are connected in parallel; during the next commutation operation, the upper power switching element IGBTo switches on and the current commutates into the IGBTo. During these commutation operations, if the order of the inner connecting lugs of the busbars 100 and 200 relative to the outer connecting lugs 220 and 110 of the busbars is not heeded, interfering and unfavorable asymmetry may occur as a result of redistribution effects of the load current.

The invention proposes a solution to this problem, in which the load currents are symmetrized by correctly selecting the order of the outer connecting lugs of the first and second busbars relative to the order of the inner connecting lugs of the latter and thus relative to the order of the inner connecting points of the half-bridge units which are connected in parallel.

FIG. 1A uses dashed lines to schematically illustrate a first busbar 1 in the form of a conductive plate and uses solid lines to schematically illustrate a second busbar 2 in the form of a second conductive plate for an inventive power semiconductor module. As described in more detail further below with reference to FIG. 3B, the order of the outer connecting lug 10 of the first busbar 1 and of the outer connecting lug 20 of the second busbar 2 corresponds exactly to the order of the inner connecting lugs 11 and 21, 12 and 22, 13 and 23 and 14 and 24 of the two busbars as regards each individual substrate (cf. FIG. 3B described further below). The designation outer connecting lug refers to the outer side of the two busbars 1 and 2 which points away from the substrates and the designation inner connecting lugs refers to that side of the two busbars 1 and 2 which faces the substrate.

Figure 1B:
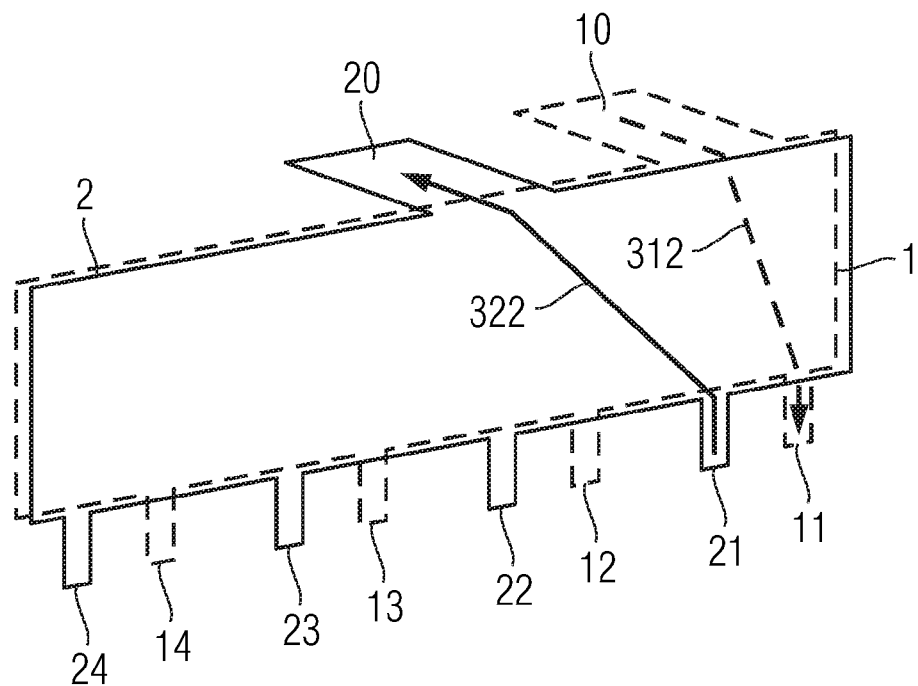
FIG. 1B illustrates main directions of the change in current di/dt for each substrate for those parts of the change in current which are caused by a first substrate of the inventive power semiconductor module having the busbars illustrated in FIG. 1A.
Figure 3A:
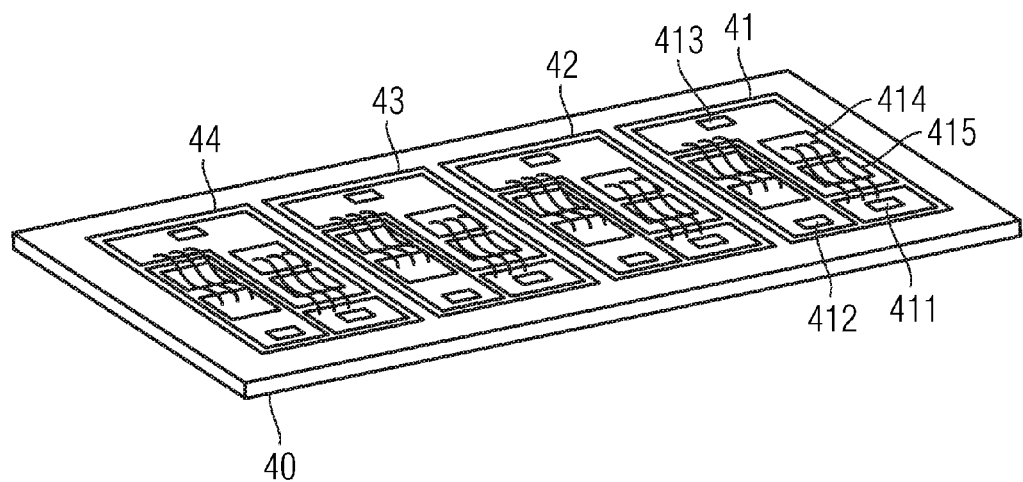
FIG. 3A illustrates a planar perspective illustration of a schematic circuit arrangement having substrates which are arranged in one row and contain circuit elements in a half-bridge configuration, the substrates in the inventive power semiconductor module being able to be connected in parallel using the busbar structure illustrated in FIG. 1A.
Figure 3B:
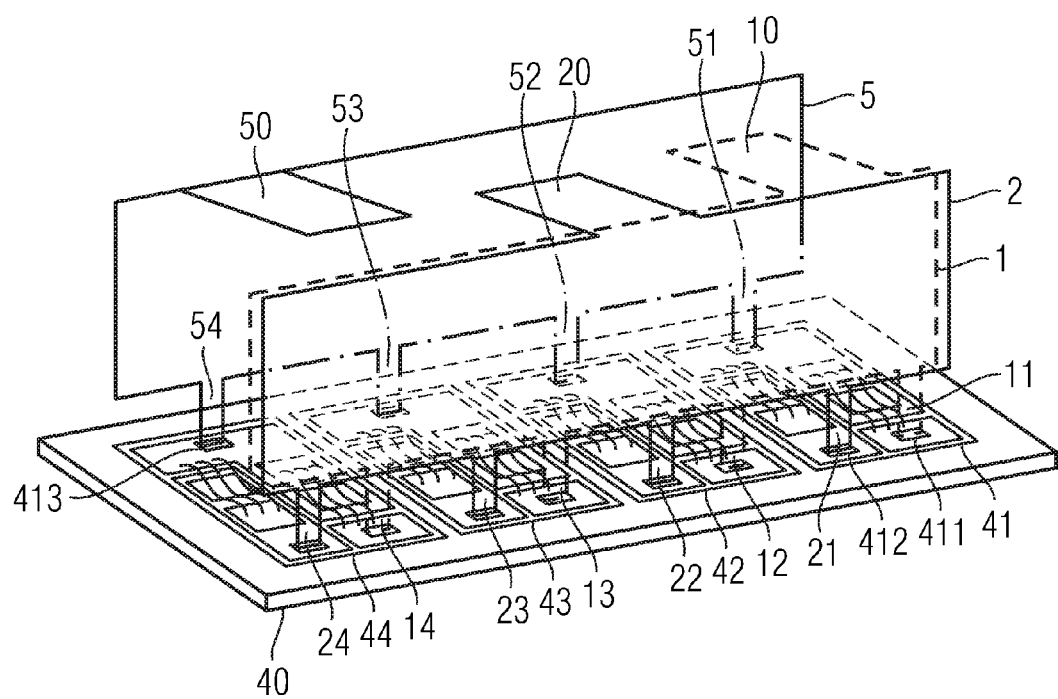
FIG. 3B schematically illustrates, in perspective, the structure of a complete power semiconductor module having a busbar structure as illustrated in FIG. 1A and having an additional busbar for the alternating current connection for the purpose of connecting the half-bridges on the individual substrates in parallel.

As regards the inventive structure (just explained) of the first and second busbars 1 and 2, FIG. 1B illustrates main directions of the change in current di/dt for each substrate (for example, in this case, for an individual substrate 41 which is on the right as illustrated in FIG. 3B) for those parts of the change in current which are caused by said substrate. The arrow 312 illustrates the part of the change in current for the operation of switching off the power switching element in the lower half-bridge path of this substrate 41 (as illustrated in FIG. 3B) and the arrow 322 illustrates the part of the change in current for the operation of switching on the freewheeling diode in the upper half-bridge path for the same substrate. FIG. 1B makes it clear that the order of the connecting lugs must be configured in such a manner that, for each substrate, the projections of the main direction of the changes in current do not cross in the plane of the two busbars 1 and 2. That is to say the structure of the two busbars 1 and 2 illustrated in FIG. 1B and the order of their inner connecting lugs 11 and 21, 12 and 22, 13 and 23 and 14 and 24 relative to their outer connecting lugs 10 and 20 ensure that said projections of the main directions of the changes in current do not cross in the plane of the two busbars 1 and 2.

It should be noted that the first busbar 1 for a lower potential is arranged such that it is plane-parallel to the second busbar 2 for an upper potential, that the inner connecting lugs 11, 12, 13 and 14 of the first busbar 1 are located in the plate plane of the latter and that the inner connecting lugs 21, 22, 23 and 24 of the second busbar 2 for an upper potential are located in the plate plane of the latter. Furthermore, a plurality of outer connecting lugs 10, 20 may also be arranged on each busbar 1, 2.

Figure 2:
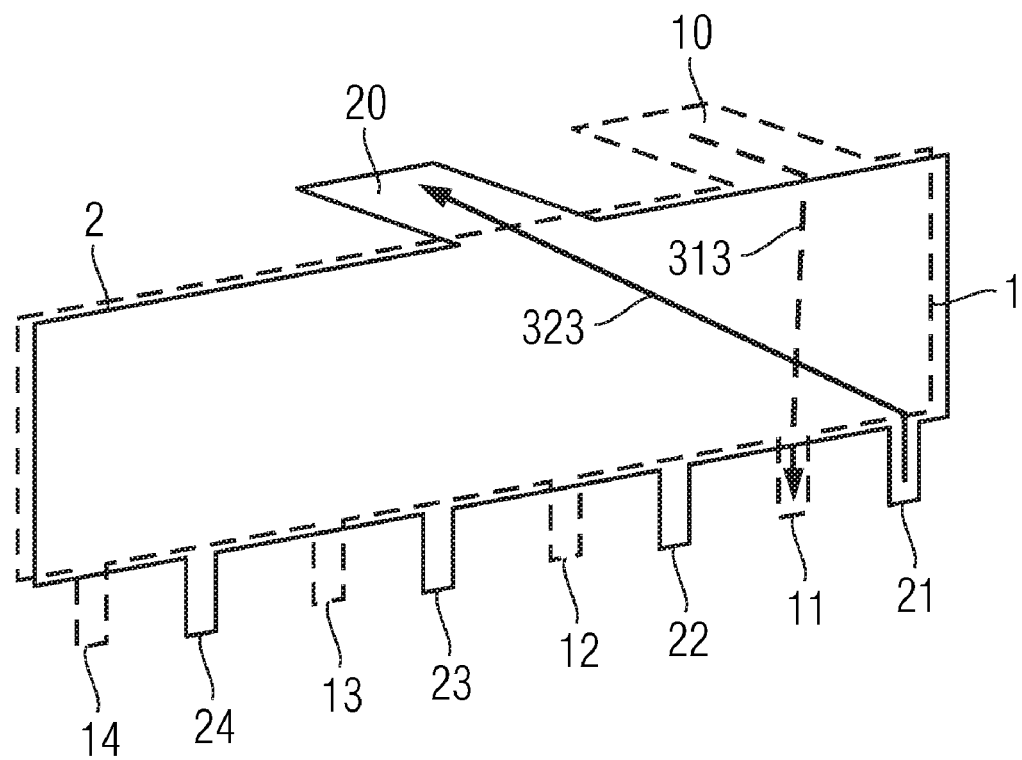
FIG. 2 illustrates a comparison illustration in which the inventive structure of the busbars was not used and in which, in contrast to the main directions of the changes in current illustrated in FIG. 1A, the projections of the main directions of the changes in current, which occur for each substrate, cross in the plane of the busbars.

FIG. 2 schematically illustrates an inverse illustration to the inventive structure of the first and second busbars 1 and 2 illustrated in FIGS. 1A and 1B. In this case, it can be clearly seen that the order of the inner connecting lugs 11 and 21, 12 and 22, 13 and 23 and 14 and 24 of the respective first busbar 1 for a lower potential and of the second busbar 2 for an upper potential is the reverse of the order of their outer connecting lugs 10 and 20. The arrow 313 illustrates the part of the change in current for the operation of switching off the power switching element in the lower half-bridge path of the first substrate (41 as illustrated in FIG. 3B) and the arrow 323 illustrates the part of the change in current for the operation of switching on the freewheeling diode in the upper half-bridge path of the same substrate. In the case of the structure of the busbars 1 and 2 illustrated in FIG. 2, the projections of the main directions of the changes in current, which occur for each substrate, cross in the plane of the busbars.

FIG. 3A schematically illustrates, in perspective, an arrangement having, for example, four substrates each having power switching elements and freewheeling diodes in a half-bridge configuration which, according to the invention, are connected in parallel with the two busbars 1 and 2 illustrated in FIGS. 1A and 1B. The four substrates 41, 42, 43 and 44 are fastened to a carrier plate 40 in a row. For the first substrate 41 on the right-hand side, 411 denotes a connecting region for a first inner connecting lug of the first busbar 1 for a lower (negative) potential (see numeral 11 in FIGS. 1A and 1B), 412 denotes a connecting region for a first inner connecting lug of the second busbar for an upper (positive) potential (see FIGS. 1A and 1B), 413 denotes a connecting region for a first inner connecting lug of an alternating current busbar 5 illustrated in FIG. 3B, 414 denotes a power switching element in the lower half-bridge path of the first substrate 41 (equivalent in the upper half-bridge path) and 415 denotes a freewheeling diode in the lower half-bridge path of the first substrate 41 (equivalent in the upper half-bridge path).

FIG. 3B schematically illustrates, in perspective, the structure of a complete power semiconductor module which includes four half-bridge units 41, 42, 43 and 44, a first busbar 1 for a lower (negative) potential, a second busbar for an upper (positive) potential and an alternating current busbar 5 and has the structure of the two busbars 1 and 2 for a lower potential and an upper potential explained with reference to FIGS. 1A and 1B. It can be clearly seen in FIG. 3B that all of the negative connecting regions 411 of all substrates 41-44 are connected in parallel with one another by means of the inner connecting lugs 11, 12, 13, 14 of the first busbar 1 for a lower electrical potential and that all of the connecting regions 412 of all substrates 41-44 on the carrier plate 40 are also connected in parallel with one another by means of the inner connecting lugs 21, 22, 23 and 24 of the second busbar 2 for an upper electrical potential (positive). The plane-parallel arrangement of the plate regions of the two busbars 1 and 2 perpendicular to the plane of the carrier plate 40 is also clearly visible. Furthermore, it can be clearly seen in FIG. 3B that the outer connecting lugs 10 and 20 are respectively arranged on the first busbar 1 for a lower (negative) potential and on the second busbar 2 for an upper (positive) potential toward one end of the carrier plate 40 of the module. Although FIG. 3B illustrates, by way of example, only one outer connecting lug 10, 20 for each busbar 1, 2, each busbar 1, 2 or else one of them may have a plurality of outer connecting lugs.

FIG. 3B also illustrates an alternating current busbar 5 having inner connecting lugs 51-54 on the substrate side and, in the example, one outer connecting lug 50 which faces away from the substrates 41-44 and the carrier plate 40. As illustrated in FIGS. 3A, 3B, the negative connecting regions 411, on the one hand, and the positive connecting regions 412, on the other hand, of the substrates 41-44 are respectively located in a row. However, it must be noted that these connecting regions do not strictly have to lie on a straight (imaginary) line, with the result that the inner connecting lugs 11, 12, 13, 14 of the first busbar 1, on the one hand, and the inner connecting lugs 21, 22, 23, 24 of the second busbar 2 can have a certain offset in their rows.

Figure 4A:
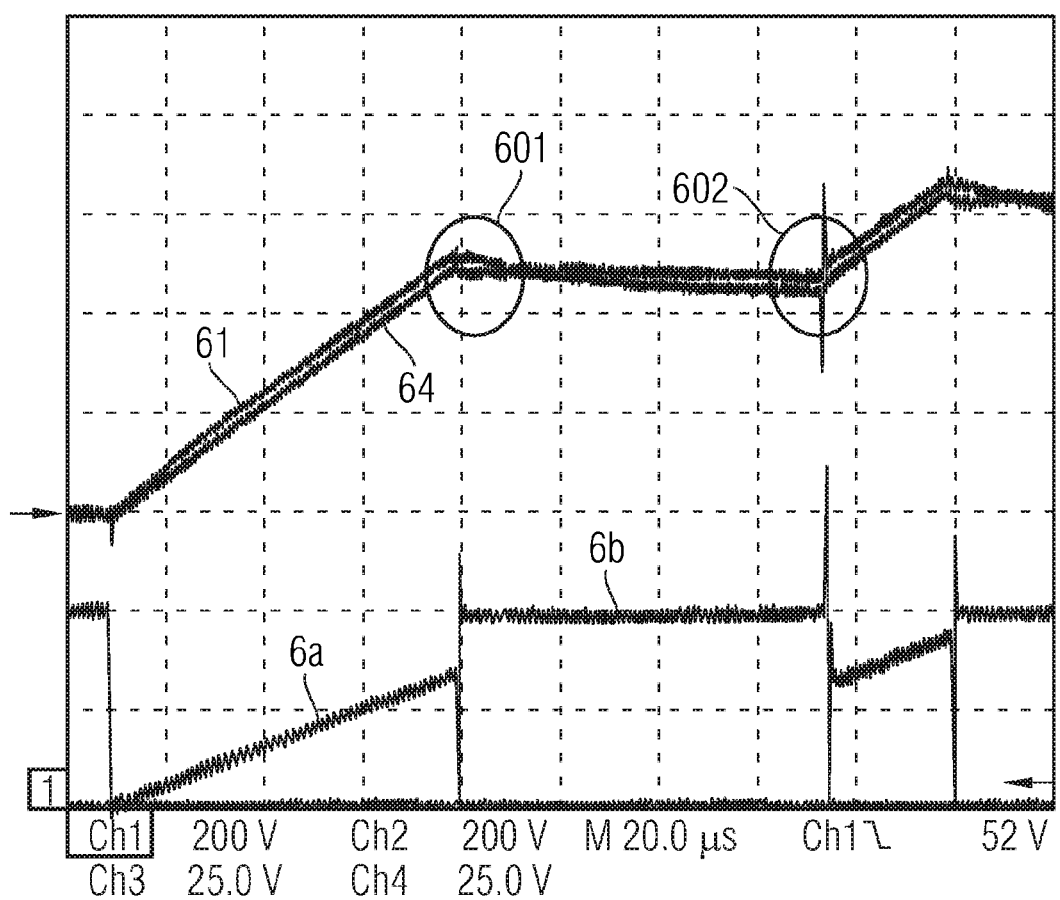
FIG. 4A uses graphs to illustrate current profiles during commutation operations in a half-bridge of the inventive power semiconductor module illustrated in FIG. 3B.

FIG. 4A uses graphs to illustrate current and voltage profiles during commutation operations for such an inventive power semiconductor module as illustrated in FIG. 3B. In said graphs, 601 denotes a commutation time interval when synchronously switching off all four power switching elements which have been placed on the lower half-bridge paths of the substrates 41-44 and 602 denotes a commutation time interval when synchronously switching on the four power switching elements which have been placed on the lower half-bridge paths of the substrates 41-44. The line 61 illustrates the load current profile, as a partial current, when measuring at the inner alternating current connecting lug of the first substrate 41 and the line 62 illustrates the load current profile, as a partial current, when measuring at the inner alternating current connecting lug of the fourth substrate 44. Finally, the graph 6a illustrates the overall current profile when measuring at the power switching element of the lower half-bridge path and the graph 6b illustrates the voltage profile when measuring at the power switching element of the lower half-bridge path. It is worth noting in FIG. 4A that the current profiles have been effectively symmetrized in all four parallel-connected half-bridge units of the substrates 41-44.

For the purpose of comparison with FIG. 4A, FIG. 4B illustrates clear redistribution effects of the load current, in particular at the commutation time intervals denoted using 701 and 702 when respectively synchronously switching off the four power switching elements which have been placed on the lower half-bridge paths of the four substrates and when synchronously switching on the four power switching elements which have been placed on the lower half-bridge paths of the four substrates. 7a uses a graph to illustrate the overall current profile when measuring at the power switching element of the lower half-bridge path and 7b uses a graph to illustrate the voltage profile when measuring at the power switching element of the lower half-bridge path. 71 illustrates the load current profile, as a partial current, when measuring at the inner connecting lug of the alternating current busbar of the first substrate and 74 illustrates the load current profile, as a partial current, when measuring at the inner connecting lug of the alternating current busbar of the fourth substrate. At the instant of the synchronous switching-off operation 701, the load current increases in the inner alternating current connecting lug of the first substrate, whereas it decreases in the inner alternating current connecting lug of the fourth substrate. In contrast, during the synchronous switching-on operation 702, the load current decreases in the inner alternating current connecting lug of the first substrate and increases in the inner alternating current connecting lug of the fourth substrate.

As regards FIG. 4B, it must be noted that the structure of the first busbar for a lower electrical potential and of the second busbar for an upper electrical potential does not correspond to the inventive structure of the latter illustrated in FIGS. 1A and 1B. If the structure rule (explained with reference to FIGS. 1A and 1B) for the mutually corresponding order of the inner and outer connecting lugs of the two busbars 1 and 2 is not heeded, clear redistribution effects of the load current, which result in asymmetry, occur during the commutation operations, as illustrated by the intervals 701 and 702 illustrated in FIG. 4B.

Figure 5A:
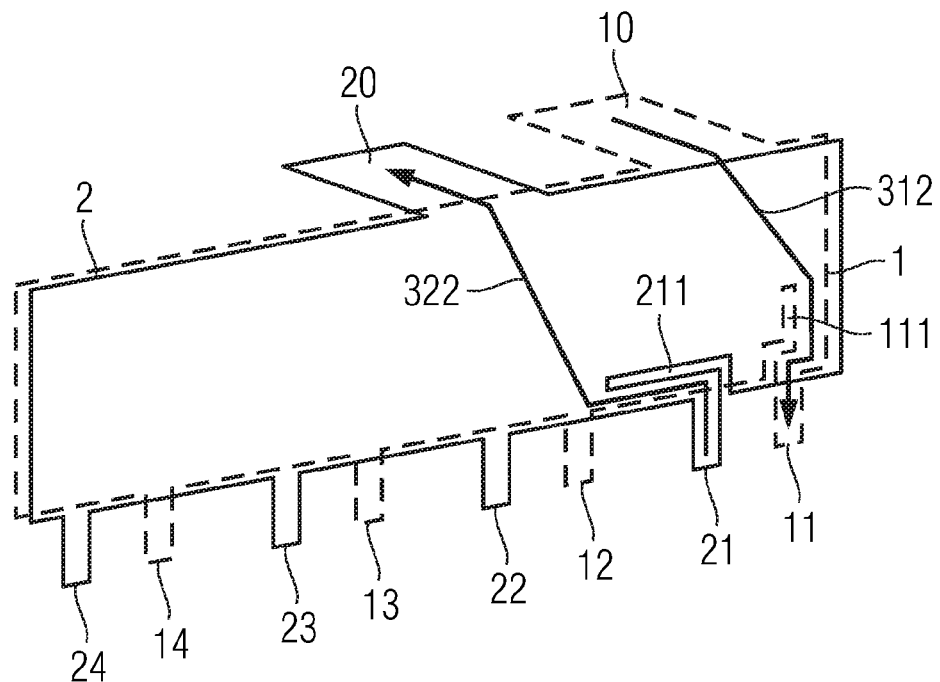
FIG. 5A illustrates one embodiment of a busbar structure as illustrated in FIG. 1A, in which the area enclosed by the two main directions of the change in current for each substrate has been enlarged using slots which are made in the busbars.

FIG. 5A schematically illustrates one development of the two busbars which have been structured according to the invention, as explained with reference to FIGS. 1A and 1B, and are respectively intended for a lower electrical potential and an upper electrical potential of an inventive power semiconductor module. In this case, the area enclosed by the two main directions of the change in current di/dt for each substrate (starting from the first substrate 41, for example) is enlarged by making slots 111 and 211 in the plate section of the busbars 1 and 2. The slot 111 is used, in the first busbar 1 for a lower (negative) potential, to effectively extend the inner connecting lug 11 into the plate region of the busbar 1. 211 denotes a slot in the second busbar 2 for an upper (positive) potential for effectively extending the inner connecting lug 21 into the plate region of the busbar 2. The arrow 312 illustrates the part of the change in current for the operation of switching off the power switching element in the lower half-bridge path of the first substrate (41 as illustrated in FIG. 3B) and the arrow 322 illustrates the part of the change in current for the operation of switching on the freewheeling diode in the upper half-bridge path of the same substrate (41 in FIG. 3B). Forming the slots in accordance with FIG. 5A makes it possible to achieve further symmetrization of the switching behavior. The optimum slot geometry can be determined using experiments or can be calculated by means of modeling in the simulation. Generally speaking, this method can also be used for the further inner connecting lugs 12, 13, 14 and 22, 23, 24 for the purpose of making contact with the other substrates 42-44. However, in this case, it is illustrated only for the connecting lugs 11 and 21 in FIG. 5A, that is to say for making contact with the first substrate 41.

Figure 5B:
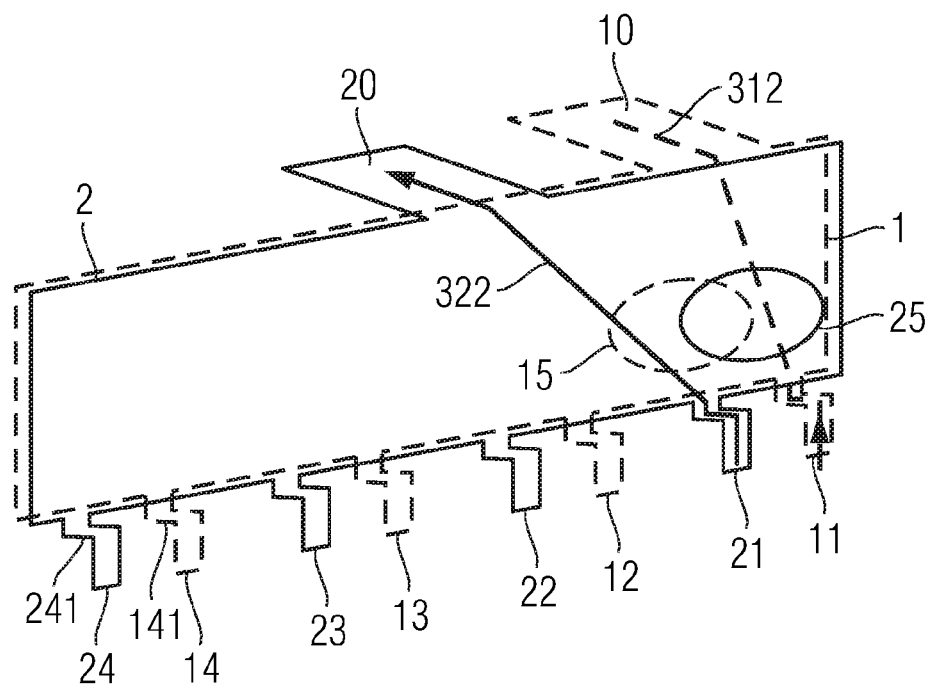
FIG. 5B illustrates another embodiment of the inventive busbar structure as illustrated in FIG. 1A, in which recesses have been made in the busbars in order to locally suppress eddy current effects.

FIG. 5B illustrates another development of an inventive power semiconductor module produced by making one or more recesses in one busbar or another, to be precise by first of all making a recess 25 in the second busbar 2 for an upper (positive) potential, which recess is arranged in the projection of the main direction of the change in current (arrow 312) for the first substrate 41. As in FIG. 1B, the arrow 312 illustrates the part of the change in current for the operation of switching off the power switching element in the lower half-bridge path of the first substrate 41, while the arrow 322 indicates the part of the change in current for the operation of switching on the freewheeling diode in the upper half-bridge path of the first substrate 41.

As regards FIG. 5B, it should be noted that eddy currents generally reduce the inductance element in the region of the conductor in which they occur. Suitably arranging recesses in the respective opposite plate region of the busbar makes it possible to manipulate the inductance element in the busbar in which a change in current takes place. Skillful arrangement of the recesses may result in further symmetrization of the switching behavior. The recess 25 (illustrated by the solid line) in the second busbar 2 for an upper (positive) potential is only exemplary. As the recess 15 (depicted using dashed lines) in the busbar 1 for a lower (negative) potential illustrates, the method can also be applied to the first busbar for a lower potential. The optimum position of the recesses is found using specific experiments or modeling in a simulation.

FIG. 5B uses the reference numerals 141 and 241 to illustrate horizontal partial sections which are fitted to the inner connecting lugs 11, 12, 13, 14 and 21, 22, 23, 24 of the respective first busbar 1 for a lower potential and of the second busbar 2 for an upper potential, said partial sections forming strain relief for the respective busbar 1 and 2.

In summary, the present invention specifies a power semiconductor module having a carrier plate 40, on which at least four substrates 41-44 are arranged, and having a first and a second busbar 1, 2 having two conductive plates, which are arranged such that they are at a distance from one another and are insulated from one another, for respectively carrying a lower and an upper electrical potential, said busbars each being fitted with outer connecting lugs which face away from the substrates and inner connecting lugs on the substrate side.

This power semiconductor module is distinguished by the fact that

- the substrates 41-44 are located in a row on the carrier plate 40,
- components 414, 415 are connected to form an electrical half-bridge on each individual substrate 41-44, and
- the connecting points 411, 412 for the respective lower and upper potentials of all substrates 41-44 are connected in parallel using the inner connecting lugs 11, 12, 13, 14 and 21, 22, 23, 24 of the respective first busbar 1, which carries the lower potential, and of the second busbar 2, which carries the upper potential,
- the base points of the inner connecting lugs 11, 12, 13, 14 and 21, 22, 23, 24 of the respective first busbar 1, which carries the lower potential, and of the second busbar 2, which carries the upper potential, being arranged behind one another in a row at the connecting points, which are associated with said connecting lugs, of the substrates 41-44 in the direction of the row of the latter, and
- the order of the connecting points for the lower and upper potentials corresponding exactly to the order of the outer connecting lugs 10, 20 on the two busbars 1, 2 in the direction of the row of the substrates 41-44 for each individual substrate 41-44.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A power semiconductor module comprising:
   a carrier plate on which at least four substrates are arranged;
   a first and a second busbar comprising two conductive plates, insulated from one another, for carrying upper and lower electrical potentials, respectively;
   the busbars being fitted with outer connecting lugs leading away from the substrates and inner connecting lugs on the substrate side; and
   wherein the power semiconductor module is configured for symmetrization of current during dynamic commutation operations via selecting an order of the outer connecting lugs of the first busbar for a lower potentialo and of the second busbar for an upper potential in accordance with the order of inner connecting points of parallel-connected half bridge circuits and of the inner connecting lugs of the first busbar and the second busbar.

2. The power semiconductor module of claim 1, comprising:
   where the order of the connecting points for the lower and upper potentials correspond exactly to the order of the outer connecting lugs on the first and second busbars in a direction of the row of the substrates for each individual substrate.

3. The power semiconductor module of claim 1, comprising wherein the outer connecting lugs for the lower and upper potentials are arranged at one end of the busbars.

4. The power semiconductor module of claim 3, comprising wherein the row of the substrates lies in the direction of a longitudinal axis of the module and the two busbars are plane-parallel to one another and are along the longitudinal axis of the module.

5. The power semiconductor module of claim 4, comprising wherein the plane-parallel busbars are arranged at a right angle to the plane of the carrier plate.

6. The power semiconductor module of claim 4, comprising wherein the inner connecting lugs are situated in the respective plate plane of each busbar.

7. The power semiconductor module of claim 4, comprising wherein strain relief in the form of a respective partial section which is angled away at a right angle to the plane of the busbar is additionally provided on the inner connecting lugs.

8. The power semiconductor module of claim 1, comprising wherein the inner connecting lugs are effectively extended by slots, which are made in the plates of the busbars, in such a manner that the inductance elements which are effective during commutation operations of the power semiconductor module are changed in such a manner that they further increase the symmetrization of the switching behavior.

9. The power semiconductor module of claim 1, comprising wherein recesses are provided in the plates of the busbars in order to influence eddy current effects.

10. The power semiconductor module as claimed in claim 1, comprising wherein the substrates additionally have alternating current connections, and wherein provision is made of an additional alternating current busbar having inner connecting lugs which connect the alternating current connections to one another.

11. A power semiconductor module having a carrier plate, on which at least four substrates are arranged, and having a first and a second busbar comprising two conductive plates, which are arranged such that they are at a distance from one another and are insulated from one another, for respectively carrying a lower and an upper electrical potential, said busbars each being fitted with outer connecting lugs which face away from the substrates and inner connecting lugs on the substrate side, comprising:
   wherein the substrates are located in a row on the carrier plate;
   components are connected to form an electrical half-bridge on each individual substrate; and
   connecting points for the respective lower and upper potentials of all substrates are connected in parallel using the inner connecting lugs of the respective first busbar, which carries the lower potential, and of the second busbar, which carries the upper potential;
   base points of the inner connecting lugs of the respective first busbar, which carries the lower potential, and of the second busbar, which carries the upper potential, being arranged behind one another in a row at the connecting points, which are associated with said connecting lugs, of the substrates in the direction of the row of the latter; and
   an order of the connecting points for the lower and upper potentials corresponding exactly to the order of the outer connecting lugs on the two busbars in the direction of the row of the substrates for each individual substrate.

12. The power semiconductor module as claimed in claim 11, comprising wherein the outer connecting lugs for the lower and upper potentials are arranged at one end of the busbars.

13. The power semiconductor module as claimed in claim 11, comprising wherein the row of the substrates lies in the direction of a longitudinal axis of the module and the two busbars are plane-parallel to one another and are along the longitudinal axis of the module.

14. The power semiconductor module as claimed in claim 13, comprising wherein the plane-parallel busbars are arranged at a right angle to the plane of the carrier plate.

15. The power semiconductor module as claimed in claim 13, comprising wherein the inner connecting lugs are situated in the respective plate plane of each busbar.

16. The power semiconductor module as claimed in claim 13, comprising wherein strain relief in the form of a respective partial section which is angled away at a right angle to the plane of the busbar is additionally provided on the inner connecting lugs.

17. The power semiconductor module as claimed in claim 11, comprising wherein the inner connecting lugs are effectively extended by means of slots, which are made in the plates of the busbars, in such a manner that the inductance elements which are effective during commutation operations of the power semiconductor module are changed in such a manner that they further increase the symmetrization of the switching behavior.

18. The power semiconductor module as claimed in claim 11, comprising wherein recesses are provided in the plates of the busbars in order to influence eddy current effects.

19. The power semiconductor module as claimed in claim 11, comprising wherein the substrates additionally have alternating current connections, and wherein provision is made of an additional alternating current busbar having inner connecting lugs which connect the alternating current connections to one another.

20. A power semiconductor module comprising:
a carrier plate on which at least four substrates are arranged;
a first and a second busbar comprising two conductive plates, insulated from one another, for carrying upper and lower electrical potentials, respectively;
the busbars being fitted with outer connecting lugs leading away from the substrates and inner connecting lugs on the substrate side; and
means for symmetrization of current during dynamic commutation operations via selecting an order of the outer connecting lugs of the first busbar for a lower potential and of the second busbar for an upper potential in accordance with the order of inner connecting points of parallel-connected half bridge circuits and of the inner connecting lugs of the first busbar and the second busbar.

* * * * *